Feb. 16, 1965 J. R. MOROSS ETAL 3,169,837

METHOD OF DICING SEMICONDUCTOR WAFERS

Filed July 31, 1963

INVENTORS
JOHN R. MOROSS
JOHN M. GAULT
BY
OSTROLENK, FABER, GERB & SOFFEN
ATTORNEYS 3,169,837

METHOD OF DICING SEMICONDUCTOR WAFERS

John R. Moress, Whittier, and John M. Gault, Manhattan Beach, Calif., assignors to International Rectifier Corporation, El Segundo, Calif., a corporation of California Filed July 31, 1963, Ser. No. 298,821
7 Claims. (Cl. 29—183)

This invention relates to the production of semiconductor devices, and more specifically relates to a novel method for dicing a plurality of small wafers from a large area wafer.

The dicing of semiconductor wafers which are thin wafers cut from an ingot of single crystal material such as silicon or germanium, or the like, is well known to the art. Typical methods which have been used are dicing with a diamond saw; ultrasonic dicing; sandblast dicing; etch dicing; and scribe and break dicing.

The present invention relates to an improvement in the scribe and break dicing technique wherein the large area wafer which is to be diced is cut in such a direction that its natural cleavage lines coincide with the scribe lines of the dicing pattern. Therefore, by selecting the appropriate crystallographic plane for the wafer, one can scribe and break squares, rectangles, triangles or hexagon-shaped diced elements with great ease.

The actual breaking after scribing can be accomplished in any desired manner, as by ultrasonic breaking wherein the scribed slice is immersed in a liquid and subjected to ultrasonic energy. This method is of particular importance when the scribe lines are not straight across the slice as where a hexagonal scribe pattern is impressed on the wafer.

With this novel invention, the major advantage is realized of reducing material loss during dicing, even where the diced pattern is not formed of straight intersecting lines. By way of example, the novel invention may be used for making a hexagonal cut without material loss which has previously been impossible. By being able to break the wafer into a hexagonal dice without loss of material, it now becomes economically possible to provide an approximately circular diced element which is the easiest to handle in most assembly fixtures in the assembly of a semiconductor device using the wafer element.

Accordingly, a primary object of this invention is to provide a novel method of dicing semiconductor wafers which does not lose material.

A further object of this invention is to provide a novel dicing method for silicon wafers which permits dicing into an approximately hexagonal shape without loss of material.

A further object of this invention is to provide a novel method of dicing wherein scribe lines coincide with the natural cleavage planes of the wafer.

These and other objects of this invention will become apparent from the following description when taken in connection with the drawings, in which.

Figure 1:
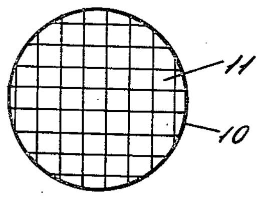
FIGURE 1 shows a top view of a silicon wafer which is oriented in the (1–0–0) direction.
Figure 3:
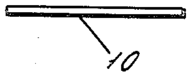
FIGURE 3 is a side view of the wafer of FIGURE 1.

Referring now to FIGURES 1 and 3, we have illustrated therein a typical wafer 10 which may be of silicon or germanium having a thickness of, for example, 20 mils and a diameter determined by the geometry of the ingot from which it is cut and which could, for example, be 1 inch.

In accordance with the present invention, the wafer of FIGURE 1 is cut from its ingot, or is otherwise suitably prepared, in such a manner that the wafer is oriented in the (1–0–0) direction. In order to dice the wafer of FIGURES 1 and 2, and in accordance with the invention, scribe lines are scribed into the wafer surface so that it coincides with the intersection of a (1–1–1) plane. The scribe lines will then coincide with the natural cleavage direction of the wafer in FIGURE 1, so that the integrity of the subsequent break along the scribe lines will be improved, and there will be substantially no material loss.

In FIGURE 1, therefore, it is easy to dice the complete wafer into rectangular dies such as die 11 which have whatever wafer dimensions are desired. The actual breakage, as indicated previously, can be accomplished in any desired manner as by immersing wafer 10 in an ultrasonic bath.

Figure 2:
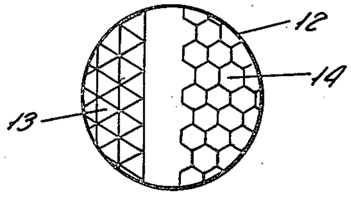
FIGURE 2 illustrates a wafer similar to the wafer of FIGURES 1 and 3 which is oriented in the (1–1–1) direction.

Another manner in which the wafer may be oriented is illustrated in FIGURE 2 by the wafer 12 which is similar to wafer 10 of FIGURES 1 and 3, except that wafer 12 is oriented in the (1–1–1) direction. In this type of crystal (1–1–1) planes will intersect the surface parallel to the scribe lines. Therefore, the scribe lines can take the form of a triangular array 13 which results in triangularly shaped dies or in a hexagonal array 14 which takes the shape of hexagonal dies after the dicing operation is completed.

After the appropriate scribe lines are impressed on the wafer 12, the wafer is broken along these natural planes of cleavage in any appropriate manner.

It is to be noted that by breaking the wafer into hexagonal dies, there are particular advantages which flow since the hexagonal shape most nearly approximates a circle and thus can be used in most available assembly fixtures used for assembling the wafer elements in a semiconductor device.

Although this invention has been described with respect to its preferred embodiments, many variations and modifications will now be obvious to those skilled in the art, and it is preferred, therefore, that the scope of this invention be limited not by the specific disclosure herein, but only by the appended claims.

The embodiments of the invention in which an exclusive privilege or property is claimed are defined as follows:

1. The method of dicing a large area wafer of single crystal semiconductor material comprising steps of cutting said wafer in a predetermined crystallographic plane, scribing dice lines on the surface of said wafer which are parallel to the natural cleavage direction and breaking said wafer into a plurality of dies along said scribed lines.

2. The method of dicing a large area wafer of single crystal semiconductor material comprising the scribing of lines parallel to the natural cleavage directions of said wafer and breaking said wafer along said scribe lines.

3. The method of forming a predetermined number of small single crystal semiconductor wafers from a large area wafer comprising the formation of said wafer with a predetermined orientation of its crystallographic plane, the scribing of lines on said wafer in directions parallel to the natural cleavage direction of said wafer, and the breaking of said wafer along said scribe lines.

4. The method of claim 3 wherein said large area wafer is oriented in the (1–0–0) direction and said scribe lines define rectangularly shaped areas.

5. The method of claim 3 wherein said large area wafer is oriented in the (1–1–1) direction; said scribe lines intersecting one another at 60° and 120° to one another.

6. The method of claim 5 wherein said scribe lines define a plurality of hexagonal shapes.

7. A wafer of single crystal semiconductor material; said wafer having a hexagonal shape; the sides of said hexagonally shaped wafer being parallel to the natural cleavage lines of said wafer.

References Cited in the file of this patent

UNITED STATES PATENTS

| | | |
|---|---|---|
| 2,778,926 | Schneider | Jan. 22, 1957 |
| 2,970,730 | Schwarz | Feb. 7, 1961 |
| 3,040,489 | Da Costa | June 26, 1962 |
| 3,061,739 | Stone | Oct. 30, 1962 |

FOREIGN PATENTS

| | | |
|---|---|---|
| 1,098,579 | France | Mar. 9, 1955 |